United States Patent [19]
Shimizu et al.

[11] Patent Number: 6,080,444
[45] Date of Patent: *Jun. 27, 2000

[54] CVD FILM FORMING METHOD INCLUDING ANNEALING AND FILM FORMING PERFORMED AT SUBSTANTIALLY THE SAME PRESSURE

[75] Inventors: Takaya Shimizu, Nirasaki; Tatsuo Hatano, Yamanashi-ken, both of Japan

[73] Assignee: Tokyo Electron Limited, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/990,982

[22] Filed: Dec. 15, 1997

[30] Foreign Application Priority Data

Dec. 20, 1996 [JP] Japan .................................. 8-354604

[51] Int. Cl.[7] .................................. C23C 16/02
[52] U.S. Cl. .................................. 427/248.1; 427/255.23; 427/314; 427/372.2
[58] Field of Search .................................. 427/248.1, 250, 427/253, 255, 255.1, 255.2, 532, 533, 534, 535, 307, 309, 314, 372.2, 383.1, 383.3, 255.23; 438/643, 653, 648, 656, 660, 680, 685

[56] References Cited

U.S. PATENT DOCUMENTS 5,562,952  10/1996  Nakahigashi et al. ............ 427/534
5,567,483  10/1996  Foster et al. ..................... 427/535
5,610,106   3/1997  Foster et al. ................... 427/255.1
5,665,640   9/1997  Foster et al. ..................... 427/575

FOREIGN PATENT DOCUMENTS 60-261143  12/1985  Japan .

Primary Examiner—Timothy Meeks
Attorney, Agent, or Firm—Oblon, Spivak, McClelland, Maier & Neustadt, P.C.

[57] ABSTRACT

A CVD film forming method, includes the steps of placing a silicon wafer on a susceptor equipped with a heating member therein which is, situated in a chamber, evacuating the chamber, pre-annealing the silicon wafer while keeping pressure in the chamber substantially constant by supplying an anneal gas and a purge gas into the chamber and while exhausting gases from the chamber at a fixed rate, and heating the silicon wafer, there forming a metal film on the silicon wafer by CVD while keeping pressure in the chamber substantially constant by supplying a process gas into the chamber along with a purge gas with a controllable total supply rate while exhausting these gases from the chamber at a fixed rate, and heating the silicon wafer by the heating member, to follow immediately after the pre-annealing step, and then after-annealing the silicon wafer by heating the silicon wafer while maintaining pressure in the chamber substantially constant, by stopping supply of the process gas, supplying an anneal gas and a purge gas into the chamber by controlling the total rate of supplying these gases while and exhausting these gases from the chamber, to follow immediately after the film forming step. The film is one of a titanium nitride film, a titanium film and an aluminum film.

4 Claims, 4 Drawing Sheets

CVD FILM FORMING METHOD INCLUDING ANNEALING AND FILM FORMING PERFORMED AT SUBSTANTIALLY THE SAME PRESSURE

BACKGROUND OF THE INVENTION

The present invention relates to a CVD film forming method of forming a metal thin film such as Ti film or TiN film by CVD on a substrate.

In forming semiconductor devices, it is known to include metal-based thin films such as a metal wiring layer, a buried layer for electrically connecting layers to each other through a contact hole for connecting a wiring layer situated in an upper layer to a device situated in a lower layer, or through a via hole for connecting an upper layer to a lower layer, and a barrier layer having a two-layered structure of Ti (titanium) film and TiN (titanium nitride) film, formed for the prevention of the diffusion, prior to the formation of the buried layer.

Such metal-based thin films are conventionally formed by physical vapor deposition; however it is becoming very difficult to form, especially, a Ti film or TiN film which constitutes a barrier film on the bottom of a hole by PVD due to the recent trends in command. That is, the devices need to be reduced in size, and the degree of integration should be increased. Further, the width of lines and the diameter of opening holes should be further decreased, and the aspect ratio must be increased.

To meet the above recent trends, a Ti film or TiN film which constitutes a barrier layer, is recently formed by chemical vapor deposition (CVD), with which formation of better quality films can be expected. In the case where a Ti film is formed by CVD, $TiCl_4$ (titanium tetrachloride) gas and $H_2$ (hydrogen) gas are generally used as reaction gas, whereas in the case where a TiN film is formed, $TiCl_4$ gas and $NH_3$ (ammonium) gas or MMH (monomethylhydrazine) are generally used as reaction gas.

In the case where a thin film described as above is formed directly or indirectly on a semiconductor wafer by the CVD, a high stress is caused on the film formed with the conventional recipe, and a crystal defect or warp is created in the semiconductor wafer after the formation of the film, due to the stress. If a wafer is warped, a crack is made in the film, which causes problems, for example, the center portion and peripheral portion having different values in the depth of focus of the exposing device in the photolithography step. When a crack is made in the film, a conduction error or overetching of an underlying layer is likely to occur.

BRIEF SUMMARY OF THE INVENTION

The object of the present invention is to provide a method of forming a film by CVD, with less stress applied on the film formed.

In general, during the formation of a film, a to-be-processed substrate or a wafer is heated by a heater provided within a susceptor serving as a base on which a substrate is placed. Therefore, if the pressure in the chamber varies during the step of forming a film, or between before and after the step, the density of the gas in the chamber varies. Consequently, the quantity of heat supplied from the susceptor to the substrate changes. Thus, the temperature of the substrate varies in accordance with the change in pressure. In connection with this point, the inventors of the present invention have found the fact that there is, generally, a difference in thermal expansion coefficient between a substrate and a film formed thereon, and therefore a stress is created in the film due to the change in temperature, which occurs when the pressure varies. It has been further found that particularly, when the substrate is made of Si, and the thin film is a metal-based film such as Ti or TiN film, even a greater difference in the thermal expansion coefficient is created between the substrate and the film, thus causing a very high stress on the film.

In order to achieve the above-described object, there is provided, according to the first embodiment of the present invention, a method of forming a film by CVD, including the steps of:

placing a substrate to be processed, on a susceptor equipped with a heating member, situated in a chamber;

forming a film on the substrate-to-be-processed, by supplying a process gas into the chamber and heating the substrate to be processed, by the heating member while maintaining the inside of the chamber at a predetermined pressure by exhausting the gas from the chamber; and annealing the substrate to be processed by heating the heating member under a pressure substantially the same as that of the predetermined pressure, either immediately before or after the film forming step.

With the above method, the variation of temperature, which occurs along with the change in pressure, can be suppressed, and therefore the stress on the thin film formed can be made very low.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the method of manufacturing a semiconductor device, according to the present invention will now be described with reference to accompanying drawings.

Figure 1:
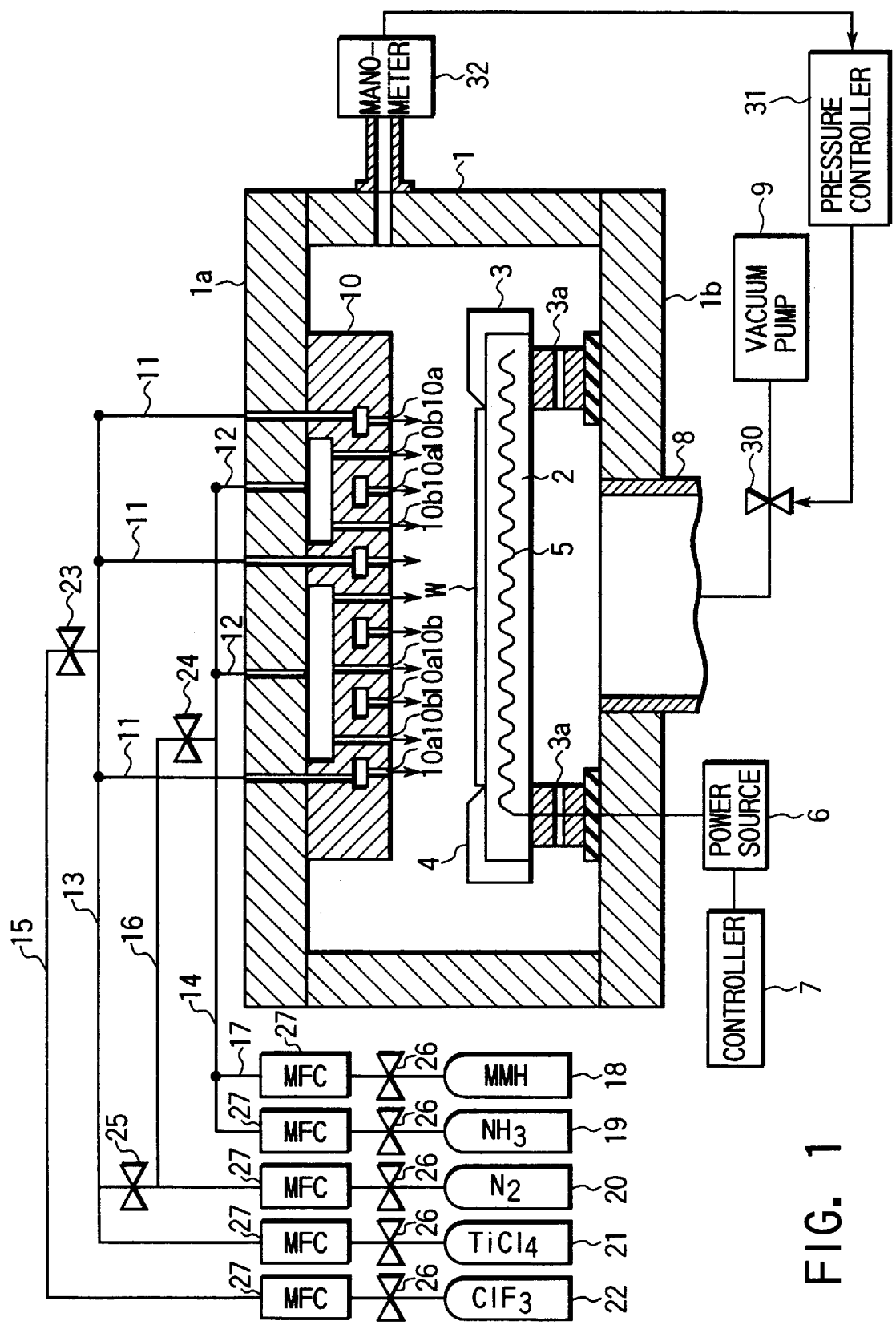
FIG. 1 is a cross sectional view schematically showing a TiN film forming device which realizes a method of forming a film by CVD, according to the present invention.

FIG. 1 is a cross sectional view schematically showing a TiN film forming device for practicing the CVD film forming method according to the present invention. The film forming device has an air-tight structure including a chamber 1 made of a metal having a high heat resistance, such as aluminum, and having substantially a cylindrical shape. In the chamber 1, a susceptor 2 for horizontally supporting a semiconductor wafer which is an object to be processed, for example, a silicon wafer W, is placed as it is supported by a cylindrical support member 3. The support member 3 has a plurality of permeating holes 3a formed therein so as to communicate the inner and outer sides of the support member, to each other. On the periphery portion of the upper surface of the susceptor 2, a guide ring 4 is provided such as to surround the semiconductor wafer W as a guide. The susceptor 2 is made of a material having a high thermal conductivity, such as aluminum, and it has a heater 5 built within itself. The heater 5 serves to heat the object to be processed, that is, the semiconductor wafer W, to a predetermined temperature, as a power is supplied to the heater from a power source 6 provided outside the device. A controller 7 is connected to the power source 6, and with the controller, the output from the heater 5 is controlled in response to a signal from a temperature sensor (not shown).

As an alternative to the case where the semiconductor wafer W is simply placed on the susceptor 2, the wafer may be supported on the susceptor by conventional means, such as a mechanical clamp, electrostatic adsorption and vacuum adsorption.

An upper end of the chamber 1 is opened, and a top wall 1a which can shut the opening is provided to be rotatable or detachable at the upper end. On the inner surface of the top wall 1a, a shower head 10 is provided to be situated in the chamber 1. A great number of gas discharge hole 10a and 10b are made in the shower head alternately in the diameter direction of the round-shaped shower head. The first group gas discharge hole 10a are connected to a plurality of (three in this example) annular channels formed in the head to be concentrical, with a predetermined distance therebetween in the circumferential direction. To these annular channels, a $TiCl_4$ gas source 21 is connected via a main pipe 13 and three branch pipes 11 branched off from the main pipe. The second group gas discharge hole 10b are connected to two empty rooms formed in the head 10. To these empty rooms, an $NH_3$ gas source 19 is connected via a main pipe 14 and two branch pipes 12 branched off from the main pipe. The shower head 10 having the gas discharge hole 10a and 10b arranged as above, is of a matrix type, which employs the post mix method, wherein $TiCl_4$ gas and $NH_3$ gas serving as reaction gases are discharged from different discharge pores alternately formed, and they are mixed together after being discharged. However, the gas supply means of the present invention is not limited to a shower head having the above-described structure, but it may be of any type of structure used in this field, as long as it can introduce a process gas to the chamber.

A main pipe 15 connected to a source 22 of $ClF_3$ gas which is a cleaning gas, and having an ON/OFF valve 23, is further connected to the main pipe 13. When the valve 23 is opened, the $ClF_3$ gas serving as a cleaning gas can be supplied into the chamber 1 via the branch pipes 11 and the discharge pores 10a. A pipe 16 connected to an $N_2$ gas source 20, and having an ON/OFF valve 24, is further connected to the main pipe 14. When the valve 24 is opened, the $N_2$ gas can be supplied into the chamber 1 via the branch pipes 12 and the discharge pores 10b. The pipe 16 for the $N_2$ gas is connected to the main pipe 13 via the ON/OFF valve 25. To the main pipe 14, a pipe 17 which extends from an MMH gas source 18 is connected, and therefore the MMH gas can be supplied into the chamber 1 from the gas discharge hole 10b via the main pipe 14 and the branch pipes 12. Each pipe extending from the gas sources 18 to 22 has a valve 26 and a mass flow controller 27 provided therefor.

An exhaust pipe 8 is connected to a bottom wall 1b of the chamber 1, and a vacuum pump 9 is connected to the exhaust pipe via a pressure control valve 30. Further, a pressure gage or manometer 32 is connected to this valve 30 via a pressure controller 31. This pressure gage detects the pressure inside the chamber 1, and the detection signal is sent to the pressure controller 31. The controller 31 controls the valve 30 in accordance with the signal received, so as to adjust the amount of exhaust within the chamber by the vacuum pump 9.

The formation of a TiN film by the device, is carried out in the following manner. First, a semiconductor wafer W is placed in the chamber 1, and while the wafer W is heated to a temperature of 450 to 600° C. by the heater 5, the inside of the chamber is evacuated by the vacuum pump 9 to create a high vacuum state. Subsequently, $N_2$ gas and $NH_3$ gas are introduced into the chamber 1 at a predetermined flow amount ratio of, for example, $N_2$ gas: 50 to 500 SCCM to $NH_3$ gas: 200 to 400 SCCM, so as to maintain the pressure inside the chamber 1, for example, about 0.3 Torr, and pre-annealing is carried out. Then, while supplying the $N_2$ gas and $NH_3$ gas into the chamber 1, a $TiCl_4$ gas is allowed to flow into the chamber 1 at a flow amount of, for example, 5 to 20 SCCM, as a pre-flow for about 5 to 20 seconds. Then, under the same condition, the formation of a TiN film is carried out for a predetermined time. During this period, MMH gas may be supplied together with the $NH_3$ gas. After that, only the supply of $TiCl_4$ is stopped, and an after-anneal is performed in the atmosphere of $NH_3$ gas for 20 seconds, for example, thus completing the formation of a film. It should be noted that $N_2$ gas, for example, should preferably be allowed to flow as a purge gas, during the period from when the semiconductor wafer W is placed in the chamber to the completion of the film formation. After the after-anneal, the chamber is once evacuated to vacuum, and then released to the atmosphere, and the semiconductor wafer W is unloaded.

The pre-anneal step, the film forming step including the pre-flow, and the after-anneal step are conducted at substantially a constant pressure (in this example, about 0.3 Torr initially set). In order to maintain the pressure at constant, it is necessary, when the $TiCl_4$ gas is supplied for forming a film, to reduce the flow of the $N_2$ gas and/or $NH_3$ gas, by the amount corresponding to the flow amount of the $TiCl_4$, or increase the amount of exhaust from the exhaust pipe 8. The adjustment of the flow amount of each gas, and/or the exhaust amount, may be carried out automatically to follow a preset sequence or when necessary by measuring the pressure in the chamber 1 at all times with the pressure gage 32. At the stages where the MMH gas is co-used in the film forming step, and where the supply of the $NH_3$ gas is stopped for the after-anneal (note that when the MMH gas is also used, the supply of this gas is also stopped), the pressure in the chamber 1 is maintained at constant, that is, about 0.3 Torr.

Figure 2:
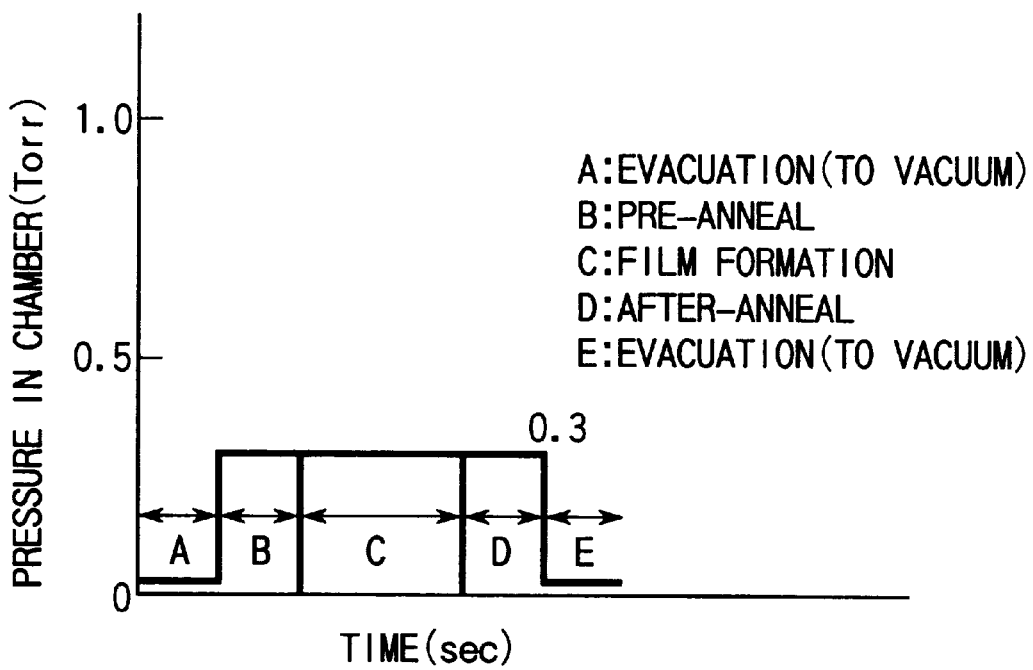
FIG. 2 is a diagram showing the pressure in the chamber during each of the steps of the method according to an embodiment of the present invention.

FIG. 2 shows the pressure in the chamber at each of the steps, with the abscissa indicating time and the ordinate axis indicating the pressure in the chamber. As can be seen in this figure, in this embodiment, the pre-purge or pre-anneal step, the film forming step and the after-purge step are carried out continuously under substantially a constant pressure of 0.3 Torr. Therefore, in these steps, a change in the temperature of the semiconductor wafer W, which is caused by a change in pressure, barely occurs, and therefore the stress on the TiN film formed can be significantly reduced.

Figure 3:
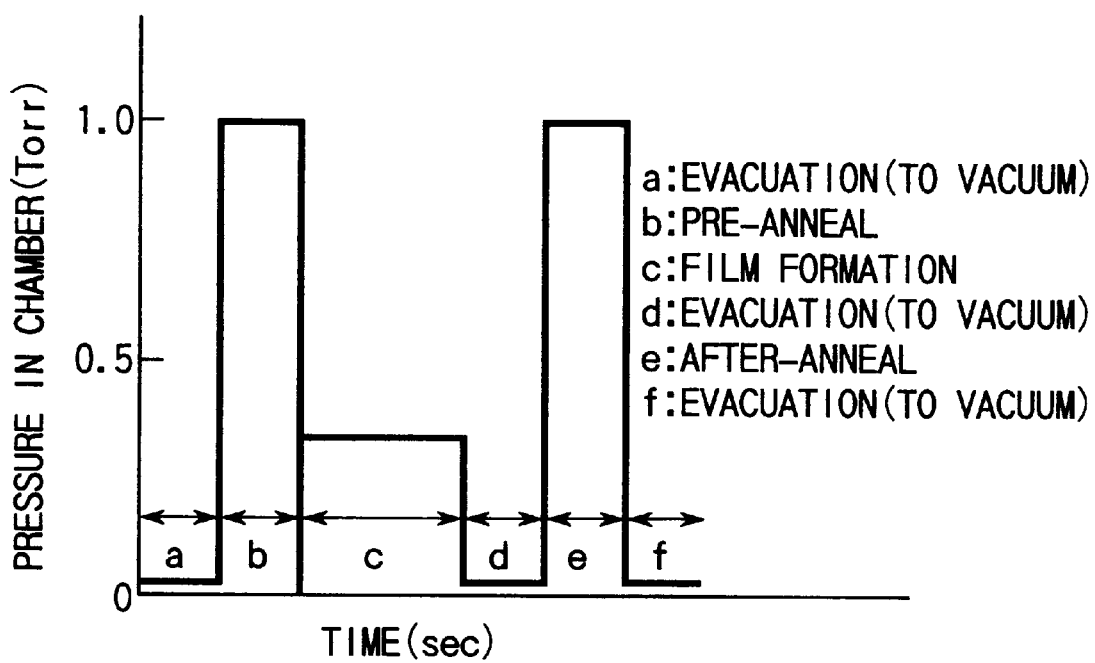
FIG. 3 is a diagram showing the pressure in the chamber during each of the steps of a conventional method.
Figure 4:
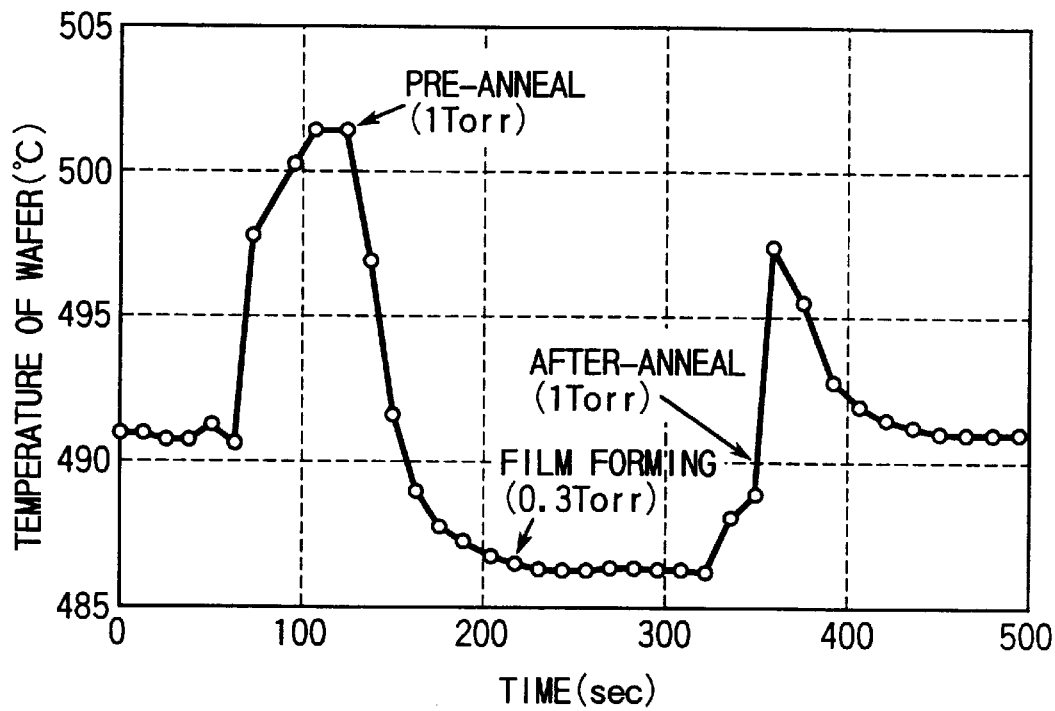
FIG. 4 is a diagram showing the variation in the temperature of the substrate when the pressure in the chamber is changed in accordance with the recipe of the conventional process.

According to the conventional method, in order to increase the temperature of the semiconductor wafer to the film forming temperature in a short time, the pressure for the pre-anneal is set at about 1 Torr, which is about three times as high as the pressure for the film formation, evacuation is conducted before the after-anneal, and the pressure for the after-anneal is set high as well at 1 Torr, as can be seen in FIG. 3. In this conventional process, the variation of pressure is remarkably large, and consequently, the variation of the temperature of the semiconductor wafer becomes large. FIG. 4 shows the results of the measurements taken for this conventional process, with the abscissa indicating time and the ordinate indicating the temperature of wafer. As can be understood from this figure, the temperature becomes high during the pre-anneal and after-anneal steps where the pressure in the chamber is high, whereas the temperature becomes low during the film forming step where the pressure in the chamber is low, with a temperature difference of about 15° C.

The thermal expansion coefficient of Si which constitutes the semiconductor wafer is $2.6 \times 10^{-6}/°$ C., and that of the TiN film is $7.1 \times 10^{-6}/°$ C. Thus, the difference between these in thermal expansion coefficient is extremely large, and therefore a heavy stress is applied on the TiN film due to the variation in temperature, which occurs during the process.

In general, a metal-based material has a thermal expansion coefficient higher than that of Si, and therefore the difference between these members in thermal expansion coefficient is inevitably large. Consequently, in most of the cases, a heavy stress is created due to the variation in temperature. For example, the thermal expansion coefficient of Ti is $9.95 \times 10^{-6}/°$ C., and those of Al and W are $2.55 \times 10^{-5}/°$ C. and $4.76 \times 10^{-6}/°$ C., respectively, which are significantly higher than the thermal expansion coefficient of Si. Consequently, a similar problem would occur when the films of these elements are formed.

In the above-described embodiment, the variation in the temperature of the substrate is suppressed by maintaining the pressure in the chamber substantially at constant throughout the pre-anneal, film formation and after-anneal steps; however, there is a certain allowable range in the variation of the temperature, and therefore there is an allowable range in the variation of the pressure. As shown in FIG. 4, there is a difference in temperature of about 15° C. resulting between the cases of 0.3 Torr and 1 Torr, and therefore, approximately, when the pressure varies by 0.1 Torr, the temperature should vary by about 2° C. When the allowable range is set to about 3° C., the pressure for the film formation may be varied within a variation allowance of ±50%.

Figure 5:
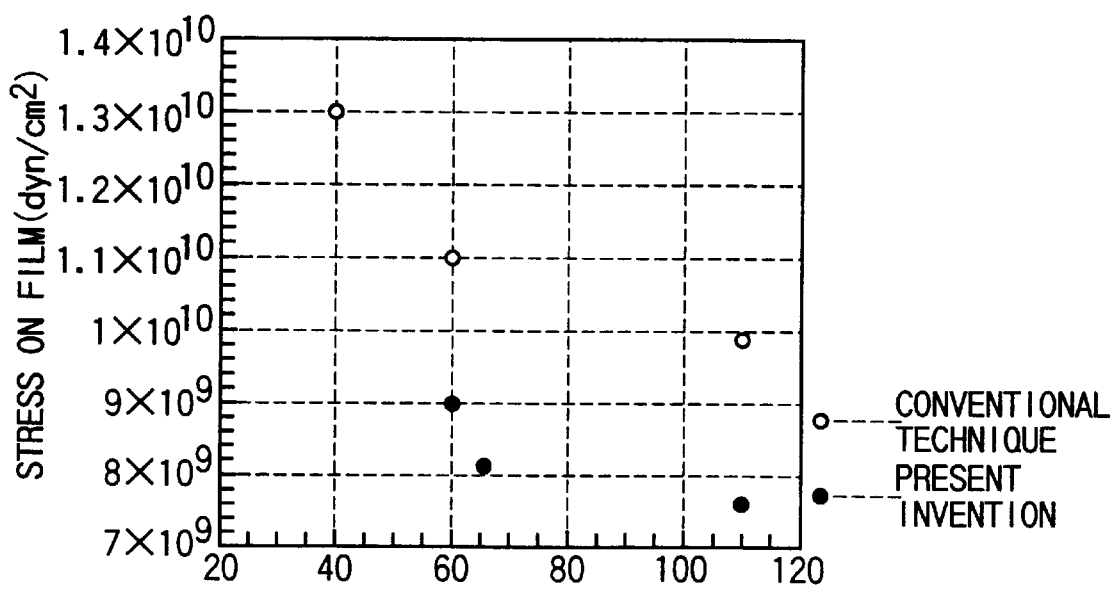
FIG. 5 is a diagram showing the relationship between the thickness of the TiN film and the stress on the film, in each of the cases where the film is formed by the present invention method and the conventional method.

TiN films of various thicknesses were actually formed with the recipe of the embodiment process of the present invention shown in FIG. 2 and that of the conventional process shown in FIG. 3, and the stress created in each film was measured. FIG. 5 illustrates the relationship between the thickness of the film and the stress created in the film. As can be understood from this figure, for substantially the same thickness of film, the stress on the TiN film can be remarkably reduced by maintaining the pressure at substantially constant through the steps as in the present invention, as compared to the conventional case.

Figure 6:
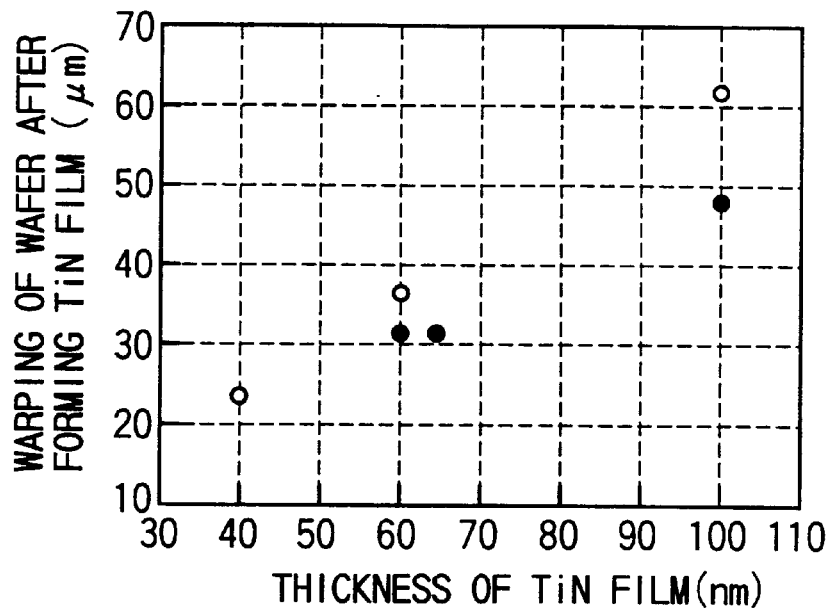
FIG. 6 is a diagram showing the relationship between the thickness of the TiN film and the amount of the wafer being warped after the formation of the TiN film, in each of the cases where the film is formed by the present invention method and the conventional method.
Figure 7:
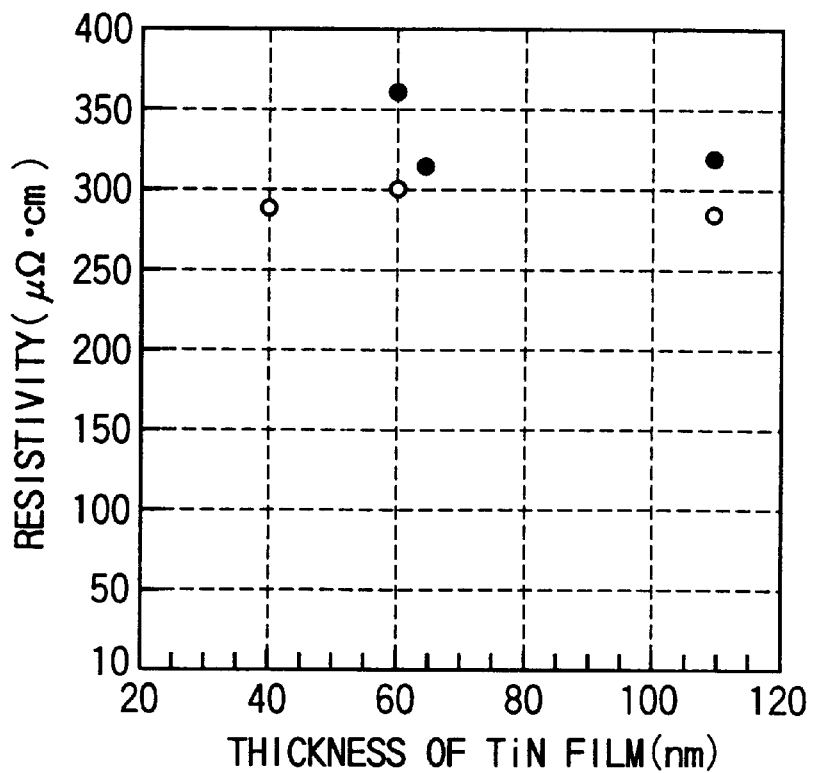
FIG. 7 is a diagram showing the relationship between the thickness of the TiN film and the resistivity, in each of the cases where the film is formed by the present invention method and the conventional method.

Further, with regard to these TiN films formed, the degree of warping and the resistivity after the formation of each film were measured. The relationship between the thickness of film and the distribution of the degrees of warping after the formation of TiN film is illustrated in FIG. 6, and the relationship between the thickness and the resistivity is illustrated in FIG. 7. It was confirmed from the results shown in these figures that, with the process of the present invention, where the pressure was set at constant, the distribution of the degrees of warping of the wafers occurring after the formation of the TiN film, was somewhat narrowed, and the resistivity was slightly increased by an amount which would bring no problem. In FIGS. 5 to 7, white circles are the results of the measurement of the films formed by the present invention, whereas black circles are those of the films formed by the conventional technique.

The present invention is not limited to the above-described embodiment, but can be modified into various version. For example, in the above-described embodiment, the pre-anneal, film formation and after-anneal steps are carried out continuously under substantially a constant pressure; however it is also possible that some other step is provided before or after those steps, or the after-anneal step may be omitted from the process. Further, the present invention is especially effective for the case where a thin film made of a metal-based material, such as TiN, Ti or Al film, is formed; however the application of the invention is not limited to this. As long as there is a difference in thermal expansion coefficient between a thin film and its substrate, a certain effect can be obtained. The substrate to be processed is not limited to a semiconductor wafer, but may be some other type, or it may be a substrate on which other layer is formed.

As described above, according to the present invention, the pressure in the chamber is maintained substantially constant during a series of steps including the formation of film, and therefore the variation in temperature, which is caused by the variation in pressure, can be suppressed, and the stress on the thin film formed can be significantly reduced. Further, the allowable range of the pressure in the chamber during a series of the steps including the film formation is set within ±50% of the pressure for the film formation, and therefore the variation in the temperature of the substrate, which is caused by the variation in pressure, can be made small, and the stress on the thin film formed can be significantly reduced, as compared to the conventional technique.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A CVD film forming method, comprising:

placing a substrate on a susceptor equipped with a heating member and situated in a chamber;

forming a film on the substrate by heating the substrate using the heating member while controlling a total rate of supplying gas including at least a process gas into said chamber so as to maintain constant pressure inside of said chamber while exhausting the gas including at least the process gas from said chamber at a fixed flow rate; and annealing the substrate by heating said substrate by using said heating member while also controlling a total rate of supplying individual gases including at least an annealing gas into the chamber while exhausting the gas including at least the annealing gas from said chamber at said fixed flow rate so as to maintain pressure in said chamber substantially constant, wherein the controlling of the total rate of supplying gas continues during changeover between the annealing step and the film forming step so as to avoid pressure change in said chamber during the changeover and wherein said annealing step occurs either immediately before or immediately after the film forming step.

2. A CVD film forming method for forming a film on a substrate in a chamber, comprising:

pre-annealing the substrate by heating the substrate while supplying gas including at least an anneal gas into said chamber;

forming a film on said substrate by heating the substrate while supplying gas including at least a process gas into said chamber; and after-annealing the film and the substrate by heating the substrate while supplying gas including at least said anneal gas into said chamber, wherein the pre-anneal step, the film forming step, and the after-anneal step are carried out in a continuous series while keeping pressure in said chamber at a substantially constant level by controlling the supplying of individual gases into said chamber in a manner establishing a constant total flow rate during and between each said step while exhausting the gases from said chamber at a fixed flow rate.

3. A CVD film forming method, comprising:

placing a silicon wafer on a susceptor equipped with a heating member and situated in a chamber;

evacuating said chamber;

pre-annealing said silicon wafer by heating said silicon wafer using said heating member while keeping a substantially constant pressure in said chamber by controlling a total rate of supplying a gas initially including at least an anneal gas into said chamber while exhausting said gas from said chamber at a fixed rate;

forming a metal-based film on said silicon wafer by heating said silicon wafer using said heating member while keeping said chamber pressure substantially constant by continuing said controlling of said total rate of supplying said gas next including at least a process gas into said chamber while exhausting said gas from said chamber at said fixed rate, said forming step immediately following said pre-annealing step; and after-annealing said metal-based film and said silicon wafer by heating said silicon wafer using said heating member while maintaining said chamber pressure substantially constant while stopping the supply of said process gas and continuing said controlling of said total rate of supplying said gas finally including at least an anneal gas into said chamber while exhausting said gas from said chamber at said fixed rate, said after-annealing step immediately following the film forming step, wherein said total rate of the initial, next and final gas supplying is constant during changeover between the pre-annealing step and the forming step and during the changeover between the forming step and the after-annealing step.

4. A CVD film forming method according to claim 3, wherein said metal-based film is one of a titanium nitride film, a titanium film or an aluminum film.

* * * * *